United States Patent
French et al.

(10) Patent No.: US 8,853,555 B2
(45) Date of Patent: Oct. 7, 2014

(54) BONDING STRUCTURE

(71) Applicant: E Ink Holdings Inc., Hsinchu (TW)

(72) Inventors: Ian French, Hsinchu (TW); Chi-Ming Wu, Hsinchu (TW); Shu-Hao Chang, Hsinchu (TW); Ming-Sheng Chiang, Hsinchu (TW); Shu-Ping Yan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 57 days.

(21) Appl. No.: 13/753,531

(22) Filed: Jan. 30, 2013

(65) Prior Publication Data

US 2013/0327561 A1 Dec. 12, 2013

(30) Foreign Application Priority Data

Jun. 8, 2012 (TW) .............................. 101120685 A

(51) Int. Cl.
| | |
|---|---|
| *H05K 1/03* | (2006.01) |
| *H05K 1/00* | (2006.01) |
| *H05K 1/09* | (2006.01) |
| *H05K 1/11* | (2006.01) |
| *H05K 7/10* | (2006.01) |

(52) U.S. Cl.
CPC ...... *H05K 1/111* (2013.01); *H05K 2201/09663* (2013.01); *H05K 2203/0228* (2013.01); *H05K 1/11* (2013.01)
USPC ........... 174/255; 174/254; 174/257; 174/261; 174/262; 361/767

(58) Field of Classification Search
USPC ................. 174/254, 255, 257, 259, 261, 262; 257/666; 361/767
See application file for complete search history.

(56) References Cited

U.S. PATENT DOCUMENTS

| | | | | |
|---|---|---|---|---|
| 4,001,870 A | * | 1/1977 | Saiki et al. | 257/759 |
| 4,618,878 A | * | 10/1986 | Aoyama et al. | 257/759 |
| 5,043,526 A | * | 8/1991 | Nakagawa et al. | 174/250 |
| 5,629,239 A | * | 5/1997 | DiStefano et al. | 216/14 |
| 5,807,453 A | * | 9/1998 | Smith et al. | 156/150 |
| 6,839,118 B2 | | 1/2005 | Nagaoka | |
| 7,847,914 B2 | | 12/2010 | Kim et al. | |
| 2004/0263724 A1 | | 12/2004 | Kim et al. | |
| 2008/0251787 A1 | | 10/2008 | Kim | |
| 2009/0141229 A1 | | 6/2009 | Nakao | |
| 2011/0120755 A1 | * | 5/2011 | Lee et al. | 174/254 |

OTHER PUBLICATIONS

"Office Action of Taiwan Counterpart Application", issued on Jul. 11, 2014, pp. 1-7.

* cited by examiner

*Primary Examiner* — Timothy Thompson
*Assistant Examiner* — Sherman Ng
(74) *Attorney, Agent, or Firm* — Jianq Chyun IP Office

(57) ABSTRACT

A bonding structure includes a substrate, multiple first pads, multiple second pads, an insulation layer and a patterned conductive layer. The substrate has a bonding region and a predetermined-to-be-cut region. The first pads are disposed on the substrate and within the bonding region. The second pads are disposed on the substrate and within the predetermined-to-be-cut region. The insulation layer is disposed on the substrate and covers the first and second pads. The insulation layer has multiple first and second openings respectively exposing parts of the first and second pads. The patterned conductive layer is disposed on the substrate and covers the insulation layer and the parts of the first and second pads exposed out by the first and second openings, in which the patterned conductive layer is electrically connected to the first and second pads via the first and second openings.

10 Claims, 4 Drawing Sheets

BONDING STRUCTURE

CROSS-REFERENCE TO RELATED APPLICATION

This application claims the priority benefit of Taiwan application serial no. 101120685, filed on Jun. 8, 2012. The entirety of the above-mentioned patent application is hereby incorporated by reference herein and made a part of this specification.

BACKGROUND OF THE INVENTION

1. Field of the Invention

The invention generally relates to a bonding structure, and more particularly, to a bonding structure suitable to be electrically connected to an external circuit.

2. Description of Related Art

FIG. 4 is a top view illustrating a conventional bonding structure. Referring to FIG. 4, a conventional bonding structure 10 within the peripheral bonding region of a display includes a substrate 11, a plurality of pads 12 located at the substrate 11 and insulated from each other, a protection layer 13 covering the pads 12 and the substrate 11 and a surface metallic layer 14. The substrate 11 herein has a bonding region 11a and a predetermined-to-be-cut region 11b, and the pads 12 are located within the bonding region 11a. The protection layer 13 has an opening 13a and the opening 13a exposes out parts of the pads 12, so that after entirely removing the partial protection layer 13, and the flexible circuit board (FCB) then can be bonded on the pads 12 exposed by the protection layer 13. For a flexible display, the substrate 11 is spread with a layer of plastic material (not shown) thereon, and during entirely removing a part of the protection layer 13, the etching liquid would erode the plastic material to make the adhesion capability between the plastic material and the substrate 11 poor. As a result, during the successive cutting process (i.e., cutting along the line L-L), peeling phenomena happen. Since the pads are easily affected by erosions of moisture and oxygen, therefore, the regions of the pads 12 exposed out by the protection layer 13 would cover the surface metallic layer 14, in which the region of the surface metallic layer 14 must be greater than the region of each of the pads 12. Since the pads 12 do not extend into the predetermined-to-be-cut region 11b of the substrate 11 and the adhesion capability between the surface metallic layer 14 and the protection layer 13 beneath the surface metallic layer 14 is poor, the breaking off or turning up phenomena of the surface metallic layer 14 during the cutting process (i.e., cutting along the line L-L) easily happen, which further affect the quality of signal transmission.

In order to avoid the breaking off or turning up phenomena of the surface metallic layer 14 due to poor adhesion capability between the surface metallic layer 14 and the protection layer 13 beneath the surface metallic layer 14 during the cutting process (i.e., cutting along the line L-L), a conventional solution is provided, referring to FIG. 5, where the pads 12a of the bonding structure 20 extend from the bonding region 11a into the predetermined-to-be-cut region 11b, so as to make the adhesion capability between the surface metallic layer 14 and the pads 12a beneath the surface metallic layer 14 better. However, the pads 12a in such design would be exposed out after cutting and suffer the erosion of moisture and oxygen, which further makes the frame abnormal when the display receives signals and thus reduces the product reliability.

SUMMARY OF THE INVENTION

Accordingly, the invention is directed to a bonding structure with better structure reliability and electrical reliability.

An embodiment of the invention provides a bonding structure, which includes a substrate, a plurality of first pads, a plurality of second pads, an insulation layer and a patterned conductive layer. The substrate has a bonding region and a predetermined-to-be-cut region. The first pads are disposed on the substrate and located within the bonding region. The second pads are disposed on the substrate and located within the predetermined-to-be-cut region, in which the first pads and the second pads are not connected to each other. The insulation layer is disposed on the substrate and covers the first pads and the second pads, in which the insulation layer has a plurality of first openings and a plurality of second openings, the first openings respectively expose out parts of the first pads and the second openings respectively expose out parts of the second pads. The patterned conductive layer is disposed on the substrate and covers the insulation layer and the parts of the first pads and the parts of the second pads exposed out by the first openings and the second openings respectively, in which the patterned conductive layer is electrically connected to the first pads and the second pads via the first openings and the second openings.

In an embodiment of the present invention, the material of the above-mentioned substrate includes glass or plastic.

In an embodiment of the present invention, the surface area of each of the above-mentioned first pads is greater than surface area of each of the second pads.

In an embodiment of the present invention, the above-mentioned insulation layer includes an insulation covering layer and an insulation flat layer, the insulation covering layer covers the first pads and the second pads and has the first openings and the second openings, the insulation flat layer covers the insulation covering layer and exposes out the first openings and the second openings.

In an embodiment of the present invention, the above-mentioned first pads are evenly-spaced arranged and parallel to each other within the bonding region of the substrate, the second pads are evenly-spaced arranged and parallel to each other within the predetermined-to-be-cut region of the substrate, the first pads are respectively corresponding to the second pads and the first pads and the second pads have a same extension direction.

In an embodiment of the present invention, the above-mentioned patterned conductive layer includes a plurality of bar-shape conductive patterns, each of the bar-shape conductive patterns is electrically connected to the corresponding first pad and the corresponding second pad via the corresponding first opening and the corresponding second opening.

In an embodiment of the present invention, the above-mentioned bar-shape conductive patterns are insulated from each other.

In an embodiment of the present invention, the diameter of each of the above-mentioned first openings is greater than the diameter of each of the second openings.

In an embodiment of the present invention, the material of the above-mentioned patterned conductive layer includes indium-tin-oxide (ITO) or indium-zinc-oxide (IZO).

In an embodiment of the present invention, the above-mentioned first pads and the second pads are a same layer.

Based on the depiction above, since in the embodiment of the invention, the first pads and the second pads are respectively located within the bonding region and the predetermined-to-be-cut region of the substrate and not connected to each other, the patterned conductive layer can be electrically connected to the first pads and the second pads via the first openings and the second openings of the insulation layer. Consequently, during the successive cutting process on the predetermined-to-be-cut region of the substrate, the design of the bonding structure of the invention can increase the adhesion capability between the second pads and the patterned conductive layer and avoid the conventional problem, that is the problem to produce breaking off or turning up phenomena during the cutting process. Moreover, if the second pads contact the external moisture and oxygen to get oxidized after the cutting process, the electrical performance of the first pads are still unaffected. In short, the bonding structure provided by the embodiment of the invention has better structure reliability and electrical reliability.

Other objectives, features and advantages of the present invention will be further understood from the further technological features disclosed by the embodiments of the present invention in which there are shown and described preferred embodiments of this invention, simply by way of illustration of modes best suited to carry out the invention.

DESCRIPTION OF THE EMBODIMENTS

Figure 1:
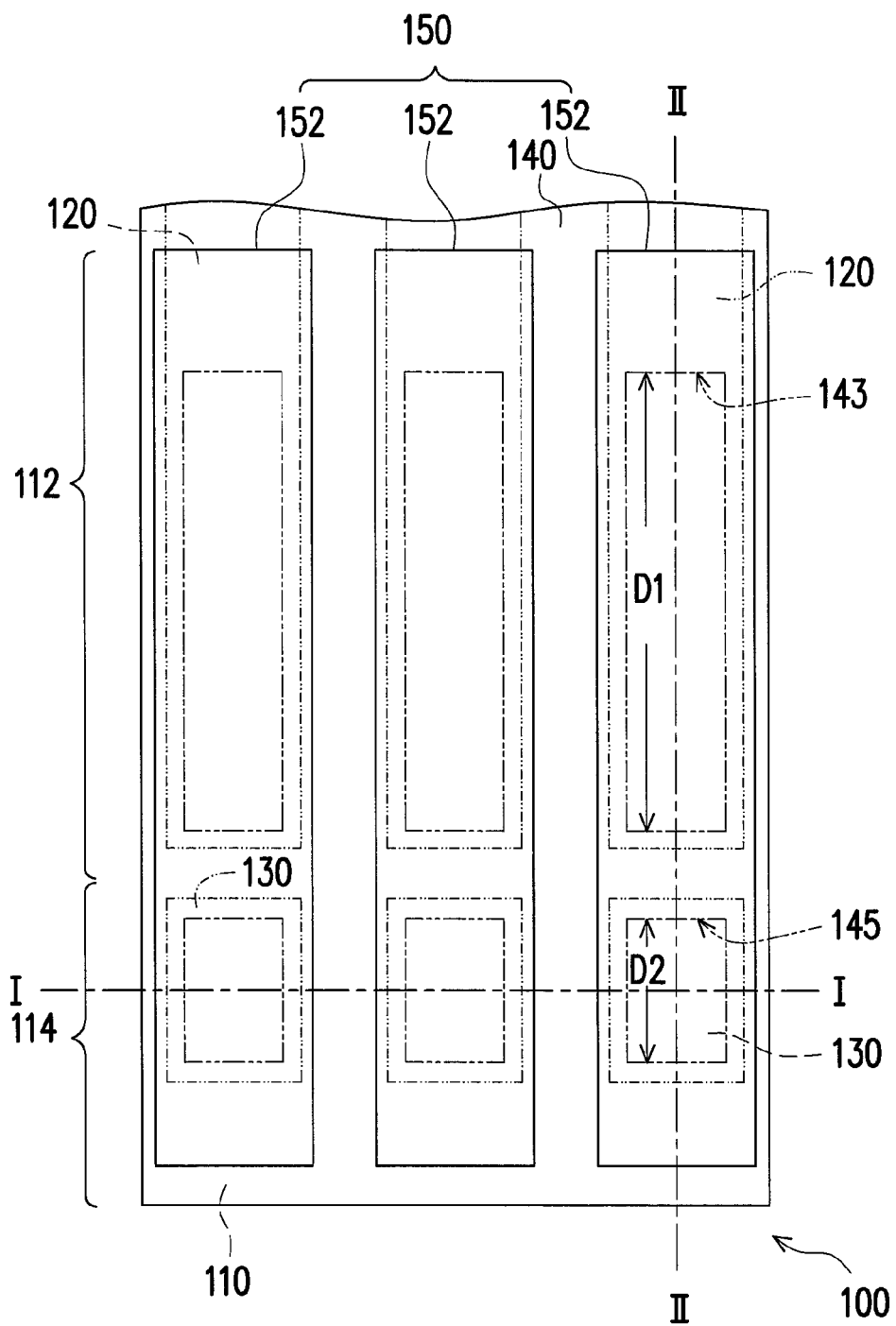
FIG. 1 is a top view illustrating a bonding structure according to an embodiment of the invention.
Figure 2:
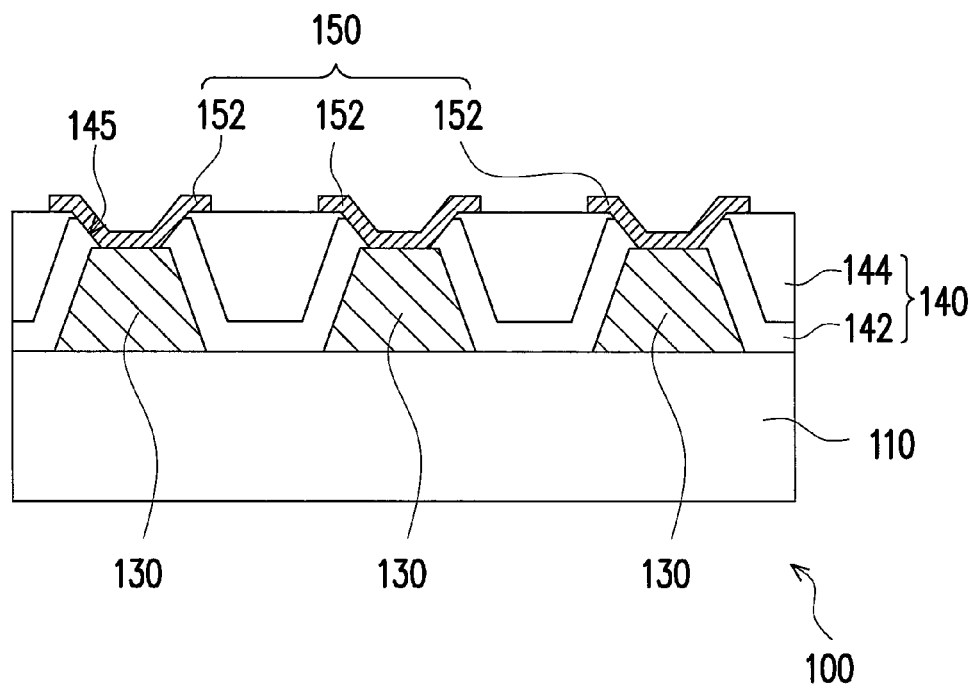
FIG. 2 is a cross-sectional diagram along the line I-I of FIG. 1.
Figure 3:
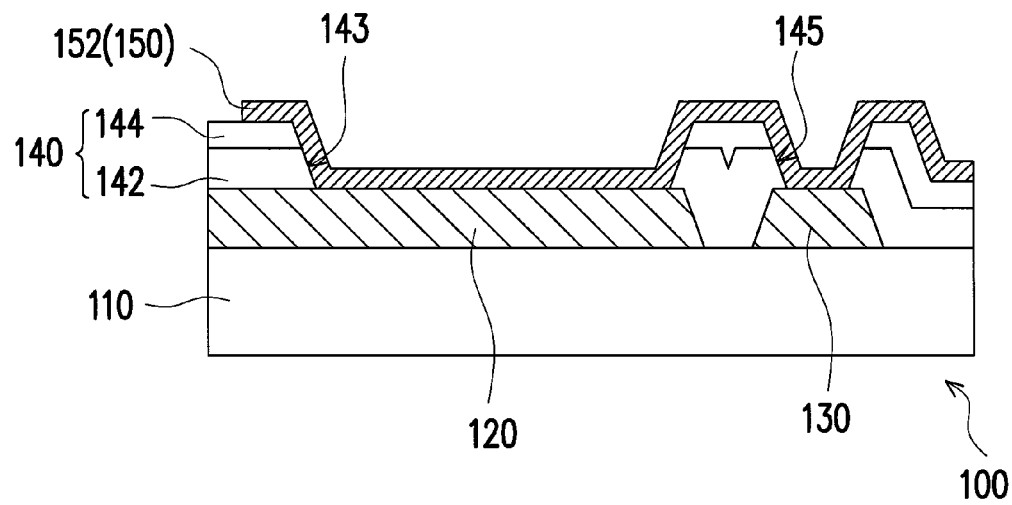
FIG. 3 is a cross-sectional diagram along the line II-II of FIG. 1.
Figure 4:
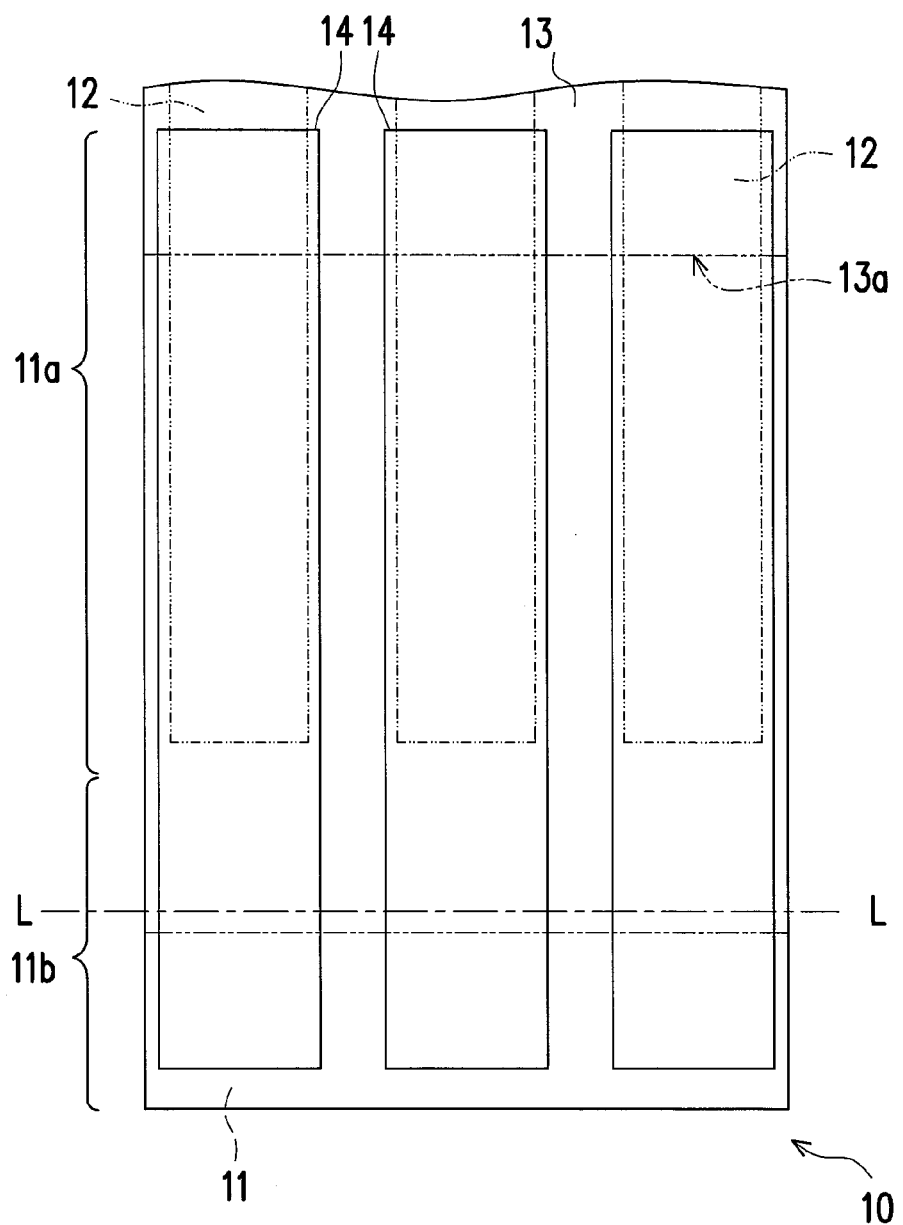
FIG. 4 is a top view illustrating a conventional bonding structure.
Figure 5:
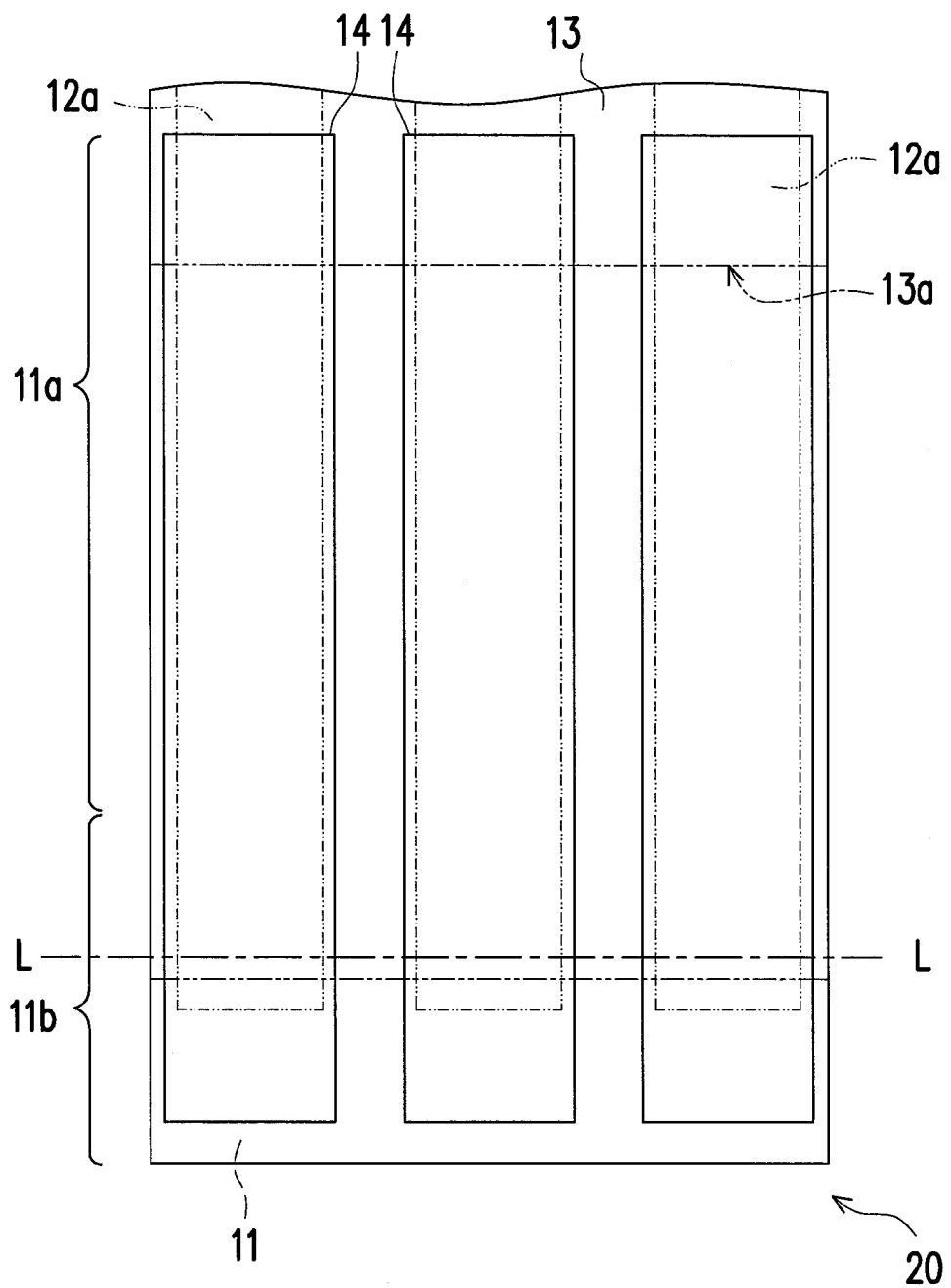
FIG. 5 is a top view illustrating another conventional bonding structure.

FIG. 1 is a top view illustrating a bonding structure according to an embodiment of the invention, FIG. 2 is a cross-sectional diagram along the line I-I of FIG. 1 and FIG. 3 is a cross-sectional diagram along the line II-II of FIG. 1. Referring to FIGS. 1, 2 and 3, in the embodiment, a bonding structure 100 includes a substrate 110, a plurality of first pads 120, a plurality of second pads 130, an insulation layer 140 and a patterned conductive layer 150.

In more details, the substrate 110 has a bonding region 112 and a predetermined-to-be-cut region 114, in which the material of the substrate 110 is, for example, glass or plastic. The first pads 120 are disposed on the substrate 110 and located within the bonding region 112, in which the first pads 120 can be served as signal pads for electrically connecting to the connection terminals (not shown) of the follow-up external circuit (for example, flexible circuit board, not shown). The second pads 130 are disposed on the substrate 110 and located within the predetermined-to-be-cut region 114, in which the second pads 130 can be serves as predetermined-to-be-sacrificed pads. In particular, the first pads 120 and the second pads 130 of the embodiment are not connected to each other.

In the embodiment, the first pads 120 are evenly-spaced arranged and parallel to each other within the bonding region 112 of the substrate 110. The second pads 130 are evenly-spaced arranged and parallel to each other within the predetermined-to-be-cut region 114 of the substrate 110. The first pads 120 are respectively corresponding to the second pads 130 and the first pads 120 and the second pads 130 have a same extension direction. That is to say, as shown by FIG. 1, one first pad 120 is solely corresponding to one second pad 130 and both the first pads 120 and the second pads 130 extend along a same direction (for example, along the cross-sectional line II-II). It should be noted that the first pads 120 and the second pads 130 herein are substantially a same layer, i.e., the first pads 120 and the second pads 130 are simultaneously fabricated in a same process. In addition, the surface area of each of the first pads 120 is substantially greater than the surface area of each of the second pads 130.

The insulation layer 140 is disposed on the substrate 110 and covers the first pads 120 and the second pads 130. In more details, the insulation layer 140 of the embodiment is composed of an insulation covering layer 142 and an insulation flat layer 144, in which the insulation covering layer 142 covers the first pads 120 and the second pads 130 and has a plurality of first openings 143 and a plurality of second openings 145. The first openings 143 respectively expose parts of the first pads 120 and the second openings 145 respectively expose parts of the second pads 130. The insulation flat layer 144 covers the insulation covering layer 142 and exposes out the first openings 143 and the second openings 145. The diameter D1 of each of the first openings 143 is substantially greater than the diameter D2 of each of the second openings 145 and the surface area of each of the first pads 120 exposed by the first openings 143 is substantially greater than the surface area of each of the second pads 130 exposed by the second openings 145.

The patterned conductive layer 150 is disposed on the substrate 110 and covers the insulation layer 140 and the parts of the first pads 120 and the parts of the second pads 130 exposed by the first openings 143 and the second openings 145 respectively. In particular, the patterned conductive layer 150 of the embodiment can be electrically connected to the first pads 120 and the second pads 130 via the first openings 143 and the second openings 145.

In more details, in the embodiment, the patterned conductive layer 150 is composed of a plurality of bar-shape conductive patterns 152, in which the bar-shape conductive patterns 152 are insulated from each other, and each of the bar-shape conductive patterns 152 can be electrically connected to a corresponding first pad 120 via the corresponding first opening 143 and to a corresponding second pad 130 via the corresponding second opening 145. The material of the patterned conductive layer 150 herein is, for example, indium-tin-oxide (ITO) or indium-zinc-oxide (IZO).

Since in the embodiment, the first pads 120 and the second pads 130 are respectively located within the bonding region 112 and the predetermined-to-be-cut region 114 of the substrate 110 and not connected to each other, the patterned conductive layer 150 can be electrically connected to the partial first pads 120 and the partial second pads 130 via the first openings 143 and the second openings 145 of the insulation layer 140. Consequently, during the successive cutting process on the predetermined-to-be-cut region 114 of the substrate 110, i.e., during the cutting process along the cutting trace (for example, along the cross-sectional line I-I), the design of the bonding structure 100 of the invention can increase the adhesion capability between the second pads 130 and the patterned conductive layer 150 and avoid the conventional problem, i.e., the problem to produce breaking off or turning up phenomena during the cutting process. Moreover, if the second pads 130 contact the external moisture and oxygen to get oxidized after the cutting process, the electrical performance of the first pads 120 are still unaffected. In addition, the insulation layer 140 of the embodiment is composed of the insulation covering layer 142 and the insulation flat layer 144 so that the insulation layer 140 has a certain thickness. As a result, if an etching process is used to form the patterned conductive layer 150, protected by the insulation layer 140, the substrate 110 would not be eroded by the etching liquid and thereby a better integrity of the substrate 110 is kept. In short, the bonding structure 100 provided by the embodiment of the invention has better structure reliability and electrical reliability.

In summary, since in the embodiment of the invention, the first pads and the second pads are respectively located within the bonding region and the predetermined-to-be-cut region and not connected to each other, the patterned conductive layer can be electrically connected to the first pads and the second pads via the first openings and the second openings of the insulation layer. Consequently, during the successive cutting process on the predetermined-to-be-cut region of the substrate, the design of the bonding structure of the invention can increase the adhesion capability between the second pads and the patterned conductive layer and avoid the conventional problem, that is the problem to produce breaking off or turning up phenomena during the cutting process. Moreover, if the second pads contact the external moisture and oxygen to get oxidized after the cutting process, the electrical performance of the first pads are still unaffected. In sort, the bonding structure provided by the embodiment of the invention has better structure reliability and electrical reliability.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A bonding structure, comprising:
   a substrate, having a bonding region and a predetermined-to-be-cut region;
   a plurality of first pads, disposed on the substrate and located within the bonding region;
   a plurality of second pads, disposed on the substrate and located within the predetermined-to-be-cut region, wherein the first pads and the second pads are not connected to each other;
   an insulation layer, disposed on the substrate and covering the first pads and the second pads, wherein the insulation layer has a plurality of first openings and a plurality of second openings, the first openings respectively expose out parts of the first pads and the second openings respectively expose out parts of the second pads; and
   a patterned conductive layer, disposed on the substrate and covering the insulation layer and the parts of the first pads and the parts of the second pads exposed out by the first openings and the second openings respectively, wherein the patterned conductive layer is electrically connected to the first pads and the second pads via the first openings and the second openings.

2. The bonding structure as claimed in claim 1, wherein the material of the substrate comprises glass or plastic.

3. The bonding structure as claimed in claim 1, wherein surface area of each of the first pads is greater than surface area of each of the second pads.

4. The bonding structure as claimed in claim 1, wherein the insulation layer comprises an insulation covering layer and an insulation flat layer, the insulation covering layer covers the first pads and the second pads and has the first openings and the second openings, the insulation flat layer covers the insulation covering layer and exposes out the first openings and the second openings.

5. The bonding structure as claimed in claim 1, wherein the first pads are evenly-spaced arranged and parallel to each other within the bonding region of the substrate, the second pads are evenly-spaced arranged and parallel to each other within the predetermined-to-be-cut region of the substrate, the first pads are respectively corresponding to the second pads and the first pads and the second pads have a same extension direction.

6. The bonding structure as claimed in claim 5, wherein the patterned conductive layer comprises a plurality of bar-shape conductive patterns, each of the bar-shape conductive patterns is electrically connected to the corresponding first pad and the corresponding second pad via the corresponding first opening and the corresponding second opening.

7. The bonding structure as claimed in claim 6, wherein the bar-shape conductive patterns are insulated from each other.

8. The bonding structure as claimed in claim 1, wherein diameter of each of the first openings is greater than diameter of each of the second openings.

9. The bonding structure as claimed in claim 1, wherein material of the patterned conductive layer comprises indium-tin-oxide (ITO) or indium-zinc-oxide (IZO).

10. The bonding structure as claimed in claim 1, wherein the first pads and the second pads are a same layer.

* * * * *